United States Patent
Zagorchev et al.

(10) Patent No.: US 10,776,913 B2
(45) Date of Patent: Sep. 15, 2020

(54) METHOD AND SYSTEM FOR QUANTITATIVE EVALUATION OF IMAGE SEGMENTATION

(71) Applicant: KONINKLIJKE PHILIPS N.V., Eindhoven (NL)

(72) Inventors: Lyubomir Georglev Zagorchev, Burlington, MA (US); Stewart Young, Hamburg (DE); Christopher Stephen Hall, Kirkland, WA (US)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 1217 days.

(21) Appl. No.: 14/402,185

(22) PCT Filed: May 23, 2013

(86) PCT No.: PCT/IB2013/054258
§ 371 (c)(1),
(2) Date: Nov. 19, 2014

(87) PCT Pub. No.: WO2013/179188
PCT Pub. Date: Dec. 5, 2013

(65) Prior Publication Data
US 2015/0146951 A1    May 28, 2015

Related U.S. Application Data

(60) Provisional application No. 61/653,761, filed on May 31, 2012.

(51) Int. Cl.
*G06T 7/00* (2017.01)
*G06T 7/11* (2017.01)
(Continued)

(52) U.S. Cl.
CPC ........ *G06T 7/0012* (2013.01); *G01R 33/5608* (2013.01); *G06T 7/11* (2017.01);
(Continued)

(58) Field of Classification Search
CPC ...... G01R 33/5608; G06T 2207/10081; G06T 2207/10088; G06T 2207/10132;
(Continued)

(56) References Cited

U.S. PATENT DOCUMENTS 5,559,901 A  *  9/1996  Lobregt ............... G06K 9/6207
                                                         382/197
5,926,568 A  *  7/1999  Chaney ................ G06K 9/6206
                                                         382/128
(Continued)

OTHER PUBLICATIONS

Kaus et al. "Model-based segmentation for treatment planning with Pinnacle", 2009, <http://incenter.medical.philips.com/doclib/enc/fetch/2000/4504/577242/591403/591458/591459/Model_based_segmentation_452296241851_LR.pdf>, last accessed Oct. 16, 2016.*
(Continued)

*Primary Examiner* — Manuchehr Rahmjoo

(57) ABSTRACT

A system and method for receiving a medical image, receiving an adaptation of a model of a physical structure, the adaptation relating to the medical image, determining an image quantity of the medical image at each of a plurality of vertices of the adaptation and aggregating the plurality of image quantities to determine an evaluation metric.

6 Claims, 4 Drawing Sheets

(51) Int. Cl.
*G06T 7/149* (2017.01)
*G01R 33/56* (2006.01)

(52) U.S. Cl.
CPC .... *G06T 7/149* (2017.01); *G06T 2207/10081* (2013.01); *G06T 2207/10088* (2013.01); *G06T 2207/10132* (2013.01); *G06T 2207/20128* (2013.01); *G06T 2207/30016* (2013.01)

(58) Field of Classification Search
CPC . G06T 2207/20128; G06T 2207/30016; G06T 7/0012; G06T 7/11; G06T 7/149
See application file for complete search history.

(56) References Cited

U.S. PATENT DOCUMENTS

| | | | | |
|---|---|---|---|---|
| 6,594,378 | B1* | 7/2003 | Li | G06T 3/0068 |
| | | | | 128/922 |
| 8,750,585 | B2 | 6/2014 | Lin | |
| 2002/0172406 | A1* | 11/2002 | Rouet | G06T 17/20 |
| | | | | 382/128 |
| 2002/0184470 | A1* | 12/2002 | Weese | G06T 7/0012 |
| | | | | 712/1 |
| 2005/0148852 | A1 | 7/2005 | Tank | |
| 2009/0226060 | A1* | 9/2009 | Gering | G06T 7/0081 |
| | | | | 382/128 |
| 2010/0046815 | A1* | 2/2010 | Von Berg | G06T 7/0024 |
| | | | | 382/128 |
| 2010/0145661 | A1* | 6/2010 | Ecabert | G06T 7/0083 |
| | | | | 703/1 |
| 2015/0146951 | A1 | 5/2015 | Zagorchev et al. | |

OTHER PUBLICATIONS

Zagorchev, L. et al. "Evaluation of Traumatic Brain Injury Patients Using a Shape-Constrained Deformable Model", Sep. 18, 2011, Multimodeal Brain Image Analysis, Berlin, pp. 118-125.
Udupa, J.K. et al. "A framework for evaluating image segmentation algorithms.", Computerized Medical Imaging and Graphics, Pergamon Press, NY, vol. 30, No. 2, Mar. 1, 2006, pp. 75-87.
Zhang, Y.J. "A survey on evaluation methods for image segmentation". Pattern Recognition, Elsevier, GB, vol. 29, No. 8, Jan. 1, 1996, pp. 1335-1346.
Gutierrez-Arriola et al. "Objective measurements to evaluate glottal space segmentation from laryngeal images", 34th Annual International Conference of the IEEE EMBS San Diego, CA, Aug. 28-Sep. 1, 2012, pp. 5396-5399.
Najjar, A. et al. "An unsupervised Evaluation Measure of Image Segmentation. Application to Flower Image Segmentation". Jul. 16, 2012, Advances in Visual Computing, Heidelberg GM, pp. 448-457.
Zagorchev, L. "Volumetric Analysis of Brain Regions in Neuropsychiatric Disorders", Dartmouth College, 2010.
Kaus, M.R. et al., "Model-based segmentation for treatment planning with Pinnacle3", 2000, Philips Medical.

* cited by examiner

Model 110

Adaptation 120

Model 210

Model 220

METHOD AND SYSTEM FOR QUANTITATIVE EVALUATION OF IMAGE SEGMENTATION

CROSS-REFERENCE TO PRIOR APPLICATIONS

This application is the U.S. National Phase application under 35 U.S.C. § 371 of International Application No. PCT/IB2013/054258, filed on May 23, 2013, which claims the benefit of U.S. Provisional Application No. 61/653,761, filed on May 31, 2012. This application is hereby incorporated by reference herein.

The ability to rapidly identify volume and shape abnormalities of specific brain areas is crucial to research programs involving patients with neurological and psychological disorders such as Alzheimer's Disease, Traumatic Brain Injury and Post-Traumatic Stress Disorder ("PTSD"), and in identifying patients at risk for such disorders. Such abnormalities can be identified using a shape-constrained deformable brain model, which can reveal subtle changes in the structure of brain regions with a known vulnerability, as compared to similar data obtained from healthy control patients. A deformable brain model can be adapted to a patient's magnetic resonance imaging ("MRI") images, and may segment the images into a number of subcortical structures. For this to be a viable technique for research and/or therapy, however, it must be able to be performed in a time-efficient manner.

An exemplary embodiment is described herein relating to a method for receiving a medical image, receiving an adaptation of a model of a physical structure, the adaptation relating to the medical image, determining an image quantity of the medical image at each of a plurality of vertices of the adaptation and aggregating the plurality of image quantities to determine an evaluation metric.

A further exemplary embodiment is described herein relating to a system having a memory storing a medical image and adaptation of a model of a physical structure, the adaptation relating to the medical image and a processor determining an image quantity of the medical image at each of a plurality of vertices of the adaptation and aggregating the plurality of image quantities to determine an evaluation metric.

A further exemplary embodiment is described herein relating to a non-transitory computer-readable storage medium storing a set of instructions executable by a processor. The instructions enabling the processor to perform a method for receiving a medical image, receiving an adaptation of a model of a physical structure, the adaptation relating to the medical image, determining an image quantity of the medical image at each of a plurality of vertices of the adaptation and aggregating the plurality of image quantities to determine an evaluation metric.

Figure 1A:
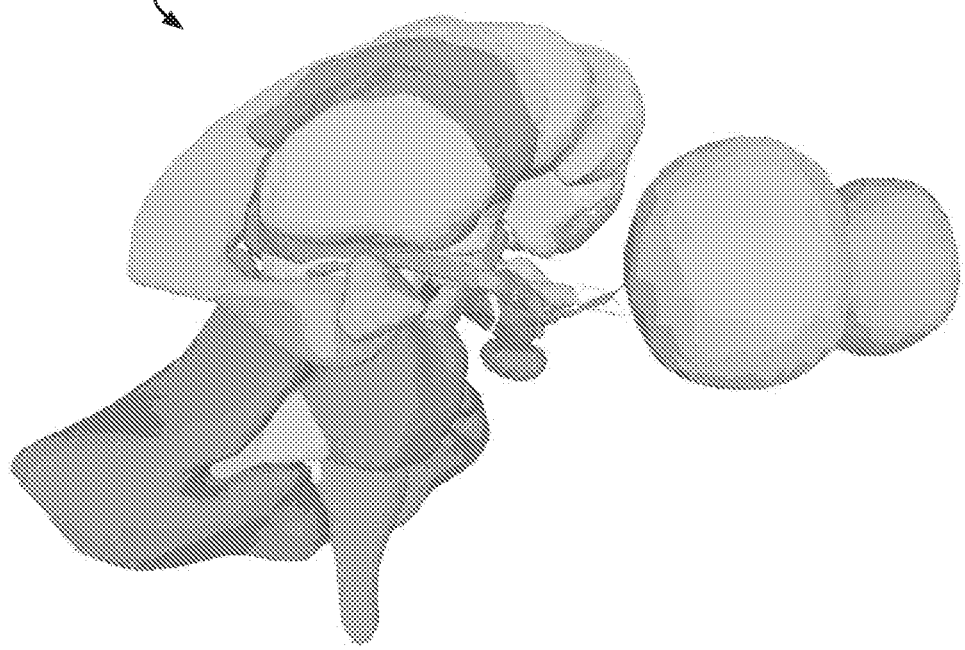
FIG. 1A shows an exemplary deformable brain model.

The exemplary embodiments may be further understood with reference to the following description of exemplary embodiments and the related appended drawings, wherein like elements are provided with the same reference numerals. Specifically, the exemplary embodiments relate to methods and systems for verifying the adaptation of a deformable brain model to a patient.

The ability to rapidly identify volume and shape abnormalities of specific brain areas is crucial to research programs involving patients with neurological and psychological disorders such as Alzheimer's Disease, Traumatic Brain Injury and PTSD, and in identifying patients at risk for such disorders. Such abnormalities can be identified using a shape-constrained deformable brain model, which can reveal subtle changes in the structure of brain regions with a known vulnerability, as compared to similar data obtained from healthy control patients. A deformable brain model can be adapted to a patient's MRI images, and may segment the images into a number of subcortical structures. For this to be a viable technique for research and/or therapy, however, it must be able to be performed in a time-efficient manner. Those of skill in the art will understand that while the exemplary embodiments will be described with specific reference to MRI images, the same techniques described herein may be equally applicable to other types of medical images, such as CT images, ultrasound images, etc.

Figure 1B:
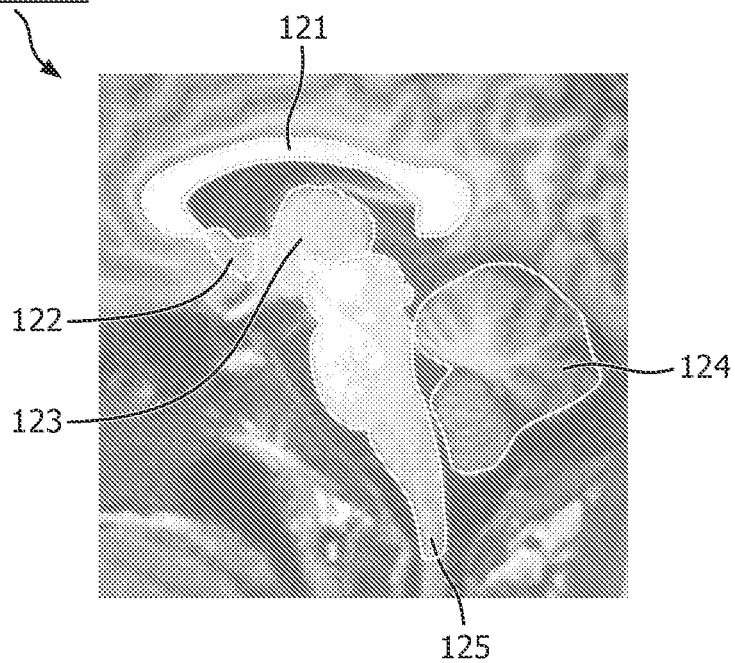
FIG. 1B shows the exemplary deformable brain model of FIG. 1A as adapted to an MRI image of a patient's brain volume.

FIG. 1A illustrates an exemplary deformable brain model 110, in which various portions of the brain are individually modeled. The deformable brain model may, for example, be that described in "Evaluation of traumatic brain injury patients using a shape-constrained deformable model," by L. Zagorchev, C. Meyer, T. Stehle, R. Kneser, S. Young and J. Weese, 2011, in *Proceedings of the First international conference on Multimodal brain image analysis* (MBIA'11), Tianming Liu, Dinggang Shen, Luis Ibanez, and Xiaodong Tao (Eds.), Springer-Verlag, Berlin, Heidelberg, 118-125. FIG. 1B illustrates an adaptation 120 of the model 110 of FIG. 1A to a patient's MRI image. In the adaptation 120, several elements 121, 122, 123, 124 and 125 of the model 110 have been mapped to the adaptation 120, illustrating the position and size of the elements 121, 122, 123, 124 and 125 in the cross-section shown by the MRI. The model shown uses ground truth data, which represent manually segmented brain structures. The ground truth data contains information about the intensity values at the boundary of each structure, which may be used to derive an image metric showing the quality of segmentation, as will be described in further detail below.

Figure 2A:
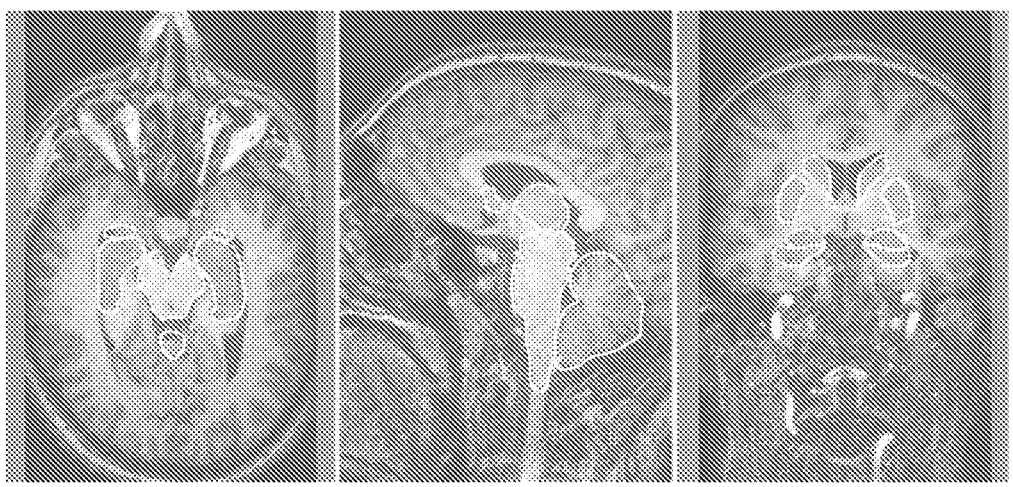
FIG. 2A shows a successful adaptation of an exemplary deformable brain model to an MRI image of a patient's brain volume.
Figure 2B:
FIG. 2B shows an unsuccessful adaptation of an exemplary deformable brain model to an MRI image of a patient's brain volume.

The adaptation of a deformable brain model to a specific patient's brain volume may be guided by forces derived from the patient's MRI image. In order to apply previous techniques for adapting such a model, a medical professional was required to load the patient's MRI image into a viewer, load the final adapted model, and visually verify whether the model had been correctly adapted. FIG. 2A illustrates an exemplary successful adaptation 210, and FIG. 2B illustrates an exemplary unsuccessful adaptation 220. It will be apparent to those of skill in the art that the elements of the successfully adapted model 210 correspond to the elements shown in the underlying MRI image, while the elements of the unsuccessfully adapted model 220 do not. Additionally, it should be noted that intensity values at mesh vertices when the model adapts unsuccessfully differ significantly from intensity values (i.e., the graphical intensity of the images) at mesh vertices when the model adapts correctly.

Verification of the success or failure of an adaptation may be a tedious and time-consuming task, particularly in clinical trials involving a large number of patients, wherein this process may add days of work. The exemplary embodiments present an adaptation quality metric that may overcome this disadvantage. The metric may be determined automatically at the end of the adaptation, and may additionally provide a basis for direct quantitative comparison of segmentation results from intra-patient or inter-patient segmentation.

Figure 3:
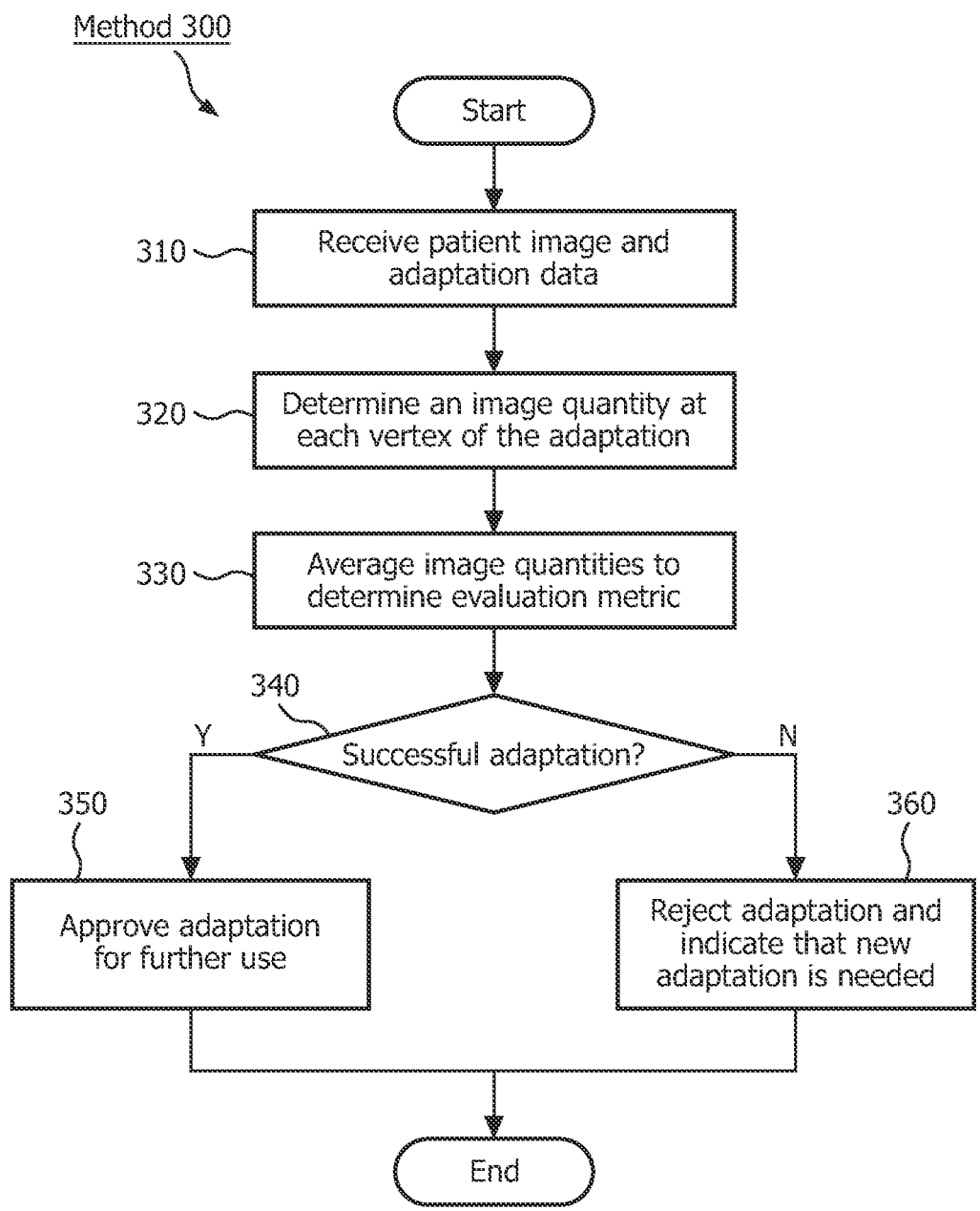
FIG. 3 shows an exemplary method for generating a metric to evaluate the success or failure of an adaptation of a deformable brain model to a brain image.

FIG. 3 illustrates an exemplary method 300 for determining a quantitative metric for use as described above. In step 310, a patient image (e.g., an MRI image) and data relating to an adapted brain model are received. Those of skill in the art will understand that, prior to this step being performed, the model must be adapted to the patient image, but that the adaptation process is beyond the scope of the exemplary embodiments.

In step 320, an image quantity is determined at each of the vertices of the mesh delineating the brain structures in the adapted brain model. Those of skill in the art will understand that the image quantity may be one or more of any number of different values that may be used to quantify the properties of the image. These values may include, for example, image intensity, image gradient, and gradient magnitude. Those of skill will further understand that a vertex of the mesh may be understood to be a point that belongs to a mesh triangle. However, other mesh shapes having vertices may also be used such as rectangles, squares, octagons, etc. Additionally, those of skill in the art will understand that the image quantity may be determined using any appropriate image processing function.

In step 330, the image quantities determined at each of the vertices are averaged to yield a quantitative metric that may be used to evaluate the adaptation of the model. As will be described in detail below, the method is not limited to the averaging of the image quantities for each vertex, as averaging is just one manner of obtaining a quantitative metric. In one embodiment, the metric may be normalized such that a perfectly adapted model yields a simplified numerical value, such as 1 or 100, and such that a model that has been adapted completely incorrectly yields a value of zero.

Next, in step 340, the adaptation of the model is verified based on the quantitative metric determined in step 330. This may be performed, for example, by comparing the metric to a threshold value, or in other manners known in the art. For example, if the quantitative metric is normalized to values of 1-100, the threshold may be set initially at 75, meaning that adaptations scoring 75 and above are considered successful, while those below 75 are not successful. This threshold value may then be reset by a user, for example, if the user decides that successful adaptations are above or below the initial threshold. In another example, the system may include a machine learning algorithm that determines the threshold level based on various inputs.

If it is determined that the model has been adapted successfully, then in step 350 the adaptation is accepted for subsequent use. Conversely, if it is determined that the model has not been adapted successfully, then in step 360 the adaptation is rejected and the need for the model to be adapted again is indicated. After step 350 or step 360, the method terminates.

In addition to the verification of the correct adaptation of a brain model, the metric described above may enable the comparison of variances, biases, or other statistics, with a confidence limit depending on the question being evaluated. The significance between groups or obtained results can also be established. The quality metric may be an indicator of reliability or confidence; a higher value would mean more accurate segmentation and vice versa. The quality metric may be correlated with obtained statistics; for example, it could be used to establish the minimum segmentation quality needed to obtain statistical significance.

In another embodiment, the model may preserve the correspondence of mesh vertices during adaptation. In such an embodiment, the value of the image quantity is compared at corresponding mesh vertices, rather than comparing an average value. Such an embodiment may provide more detailed localized information about various elements of the model (e.g., it may be determined whether some sub-regions of the model may not have adapted correctly), as opposed to the generalized accuracy information provided by the exemplary method 300 described above.

Figure 4:
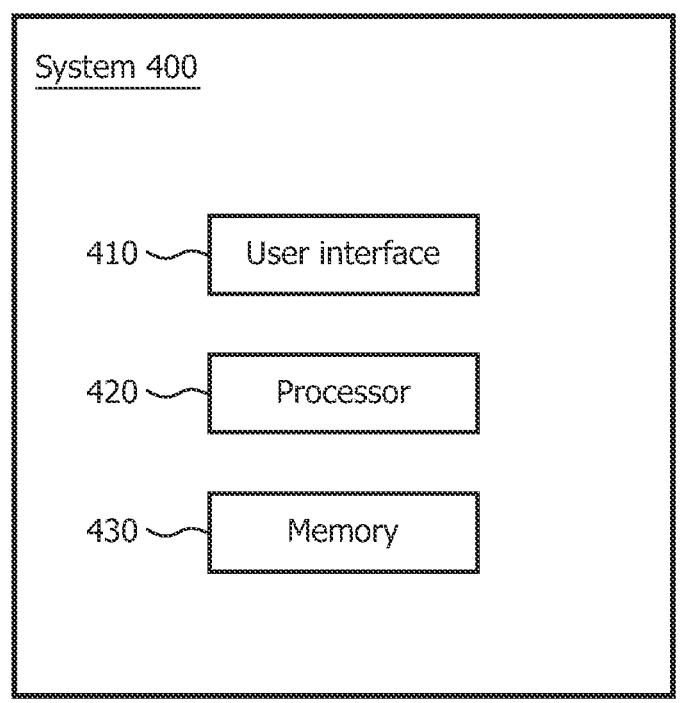
FIG. 4 shows an exemplary system for implementing a method such as the method of FIG. 3 for evaluating the success or failure of an adaptation of a deformable brain model to a brain image according to an exemplary embodiment.

The exemplary method 300 may be implemented in a variety of manners. In one example, the exemplary method 300 may be implemented by a computer through an exemplary system 400. The system 400 is illustrated schematically in FIG. 4. A user interface 410 is operable to receive various types of user input, such as a selection of medical images, adaptation models, etc. Those of skill in the art will understand that though the exemplary system 400 is shown to include a single user interface 410, other systems may use multiple interfaces, such as providing an interface to retrieve the medical images from other systems within the facility. The user interface 410 is also used as an output device, e.g., it may output successful adaptations for medical professionals to view for further use or indicate to the medical professionals that the adaptation was not successful.

The user interface 410 provides data to a processor 420 that may execute a program embodying the exemplary method 300. Data relating to this task may be stored in a memory 430. The memory 430 may be a hard drive, a solid state drive, distributed storage, etc., and may store data in any format appropriate for use as described above. In addition to the instructions necessary to perform the method 300, the memory 430 may store medical records relating to patients in the hospital housing the system 400. Alternately, patient records may be stored remotely, such as in a centralized system for storing such records.

The exemplary embodiments described above enable the automatic processing and verification of large groups of brain models for clinical studies, and provide a basis for quantitative comparison of results. Such processing may facilitate longitudinal monitoring of brain structures, improved differential diagnosis, and monitoring of the outcome of treatment or recovery. Further, the adaptation metric described above may play an important role in analyzing, understanding and interpreting the information that may be derived from a deformable brain model.

Those of skill in the art will understand that, while the above-described exemplary embodiments make specific reference to MRI images of the brain and a deformable brain model, the principles described herein may apply equally to other types of deformable models and the adaptation of other types of images to fit such models. Additionally, those of skill in the art will understand that the above-described exemplary embodiments may be implemented in any number of matters, including as a software module, as a combination of hardware and software, etc. For example, the exemplary method 300 may be embodied in a program stored in a non-transitory storage medium and containing lines of code that, when compiled, may be executed by a processor.

It is noted that the claims may include reference signs/numerals in accordance with PCT Rule 6.2(b). However, the present claims should not be considered to be limited to the exemplary embodiments corresponding to the reference signs/numerals.

It will be apparent to those skilled in the art that various modifications may be made to the exemplary embodiments, without departing from the spirit or the scope of the invention. Thus, it is intended that the present invention cover modifications and variations of this invention provided they come within the scope of the appended claims and their equivalents.

What is claimed is:

1. A system, comprising:
    a memory storing a medical image of a physical structure of a patient and an adaptation of a mesh model of the physical structure, to the medical image; and
    a processor determining an image quantity based on the intensity values of the medical image at each of a plurality of vertices of the adapted mesh model, aggregating the plurality of image quantities to determine an adaptation quality metric, comparing the adaptation quality metric to a threshold value, approving the adaptation when the adaptation quality metric is greater than or equal to the threshold value, and rejecting the adaptation and indicating a further adaptation should be performed when the adaptation quality metric is less than the threshold value.

2. The system of claim 1, further comprising:
an imaging apparatus generating the medical image.

3. The system of claim 2, wherein, after the imaging apparatus generates the medical image, the processor adapts the mesh model to the medical image to generate the adaptation.

4. The system of claim 1, wherein the image quantity is one of an image intensity, an image gradient, and a gradient magnitude.

5. The system of claim 1, wherein the processor considers each of the vertices separately to determine separate adaptation quality metrics for each of a plurality of subsets of the medical image.

6. A non-transitory computer-readable storage medium storing a set of instructions executable by a processor, to enable the processor to perform a method comprising:
    receiving a medical image of a physical structure of a patient;
    receiving an adaptation of a mesh model of the physical structure, to the medical image;
    determining an image quantity of the intensity value of the medical image at each of a plurality of vertices of the adapted mesh model;
    aggregating the plurality of image quantities to determine an adaptation quality metric;
    comparing the adaptation quality metric to a threshold value;
    approving the adaptation when the adaptation quality metric is greater than or equal to the threshold value; and
    rejecting the adaptation when the adaptation quality metric is less than the threshold value and indicating a further adaptation should be performed.

* * * * *